United States Patent [19]
Hendrickson

[11] Patent Number: 5,180,276
[45] Date of Patent: Jan. 19, 1993

[54] ARTICULATED ARM TRANSFER DEVICE

[75] Inventor: Ruth A. Hendrickson, Lincoln, Mass.

[73] Assignee: Brooks Automation, Inc., North Billerica, Mass.

[21] Appl. No.: 687,288

[22] Filed: Apr. 18, 1991

[51] Int. Cl.⁵ ............................................. G25J 18/00
[52] U.S. Cl. ...................................... 414/752; 74/98; 74/106; 74/521; 414/744.5; 901/15
[58] Field of Search ............ 414/749, 752, 751, 744.1, 414/744.5; 901/15, 24; 74/98, 106, 479, 521

[56] References Cited

U.S. PATENT DOCUMENTS

| | | | |
|---|---|---|---|
| 1,190,215 | 7/1916 | Becker | 74/521 |
| 2,282,608 | 5/1942 | Rempel | 74/521 X |
| 3,730,595 | 5/1973 | Yakubowski | 414/225 |
| 3,823,836 | 7/1974 | Cheney et al. | 414/225 |
| 3,874,525 | 4/1975 | Hassan et al. | 414/225 |
| 4,062,463 | 12/1977 | Hillman | 414/225 |
| 4,208,159 | 6/1980 | Uehara et al. | 414/225 |
| 4,666,366 | 5/1987 | Davis | 414/749 |
| 4,721,971 | 12/1987 | Fyler | 901/15 X |
| 4,730,975 | 3/1988 | Munakata | 414/744.5 X |
| 4,909,701 | 3/1990 | Hardegen et al. | 414/749 |

Primary Examiner—Michael S. Huppert
Assistant Examiner—Donald W. Underwood
Attorney, Agent, or Firm—Nields & Lemack

[57] ABSTRACT

An articulated arm transfer device employs a rhomboidal link structure defined by two separated pairs of forearms pivotally joined at the elbows and at the wrists. Each wrist supports a holding structure and the elbows are driven in mirror-image semicircular paths by a pair of upper arms which are superimmposed alternately under each pair of forearms as the upper arms are rotated about mutually adjacent shoulder joints. The motion is such that at any time one holding structure is moving rapidly between an extended position and a park position while the other holidng structure is slowly traveling a negligible distance between a park position and a retracted position.

9 Claims, 8 Drawing Sheets

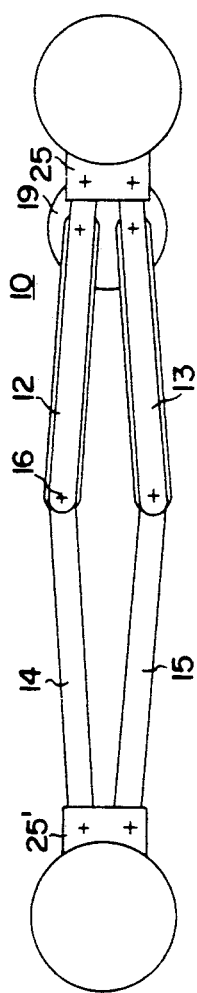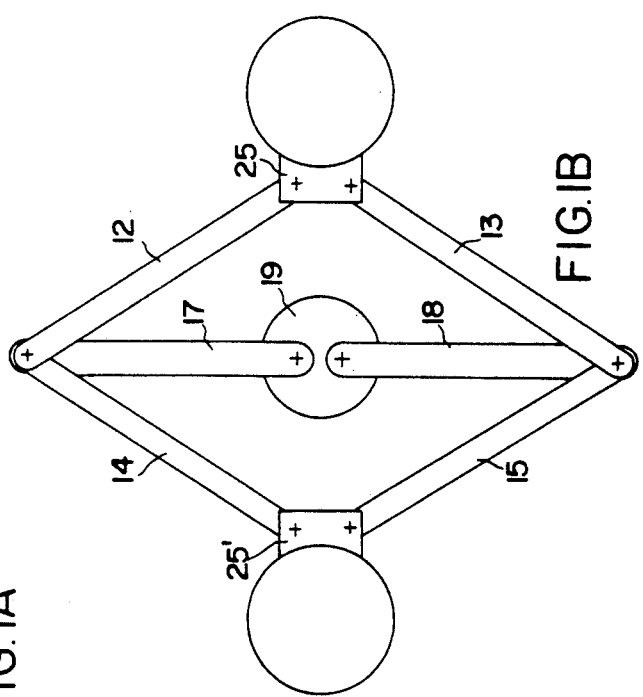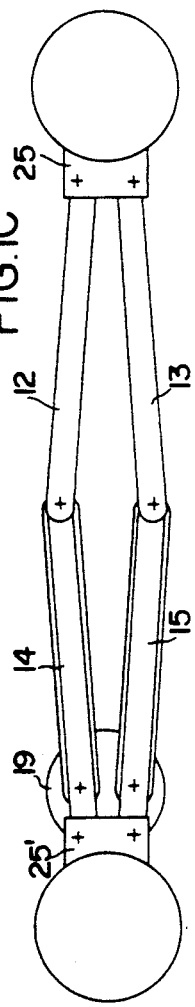

ARTICULATED ARM TRANSFER DEVICE

BACKGROUND OF THE INVENTION

1. Field of the Invention

The apparatus of the present invention relates generally to material transfer devices. The material transferred might include, but not be limited to, semiconductor wafers, such as Silicon and Gallium Arsenide, semiconductor packaging substrates, such as High Density Interconnects, semiconductor manufacturing process imaging plates, such as masks or reticles, and large area display panels, such as Active Matrix LCD substrates.

2. Description of the Prior Art

The transfer of delicate silicon wafers or the like between a plurality of work stations or locations in the manufacture of semiconductor devices presents unique handling problems. The silicon wafers are very delicate and have highly polished surfaces. When the wafers are abruptly moved, they tend to slide. This sliding action can cause the silicon wafers to abrade or alternatively can cause damage to their edges if they collide.

There are numerous devices described in the prior art for transferring silicon wafers. For example:

U.S. Pat. No. 3,823,836 discloses an apparatus which includes a supply carrier with a plurality of ledges to hold the silicon wafers and a withdrawal device having a vacuum chuck. The vacuum chuck is attached to an elevator which raises and lowers the chuck. A horizontal transfer arm coupled to the vacuum chuck is used to transfer the silicon wafer from the supply carrier to a desired work station.

U.S. Pat. No. 3,730,595 discloses a wafer transfer handling apparatus having an indexable carrier for transferring wafers to and from work stations. Wafers enter and leave the wafer carrier on an air slide with the aid of a wafer ejector acceptor arm having directional air jets. The wafer ejector acceptor arm controls the driving of the wafers into or out of the carrier from or onto the air slide, which moves the wafers to or from a work station.

U.S. Pat. Nos. 4,062,463, 3,874,525 and 4,208,159 also disclose wafer transfer devices which include either pneumatic components or gripping devices for handling the wafers.

U.S. Pat. Nos. 4,666,366 and 4,909,701 disclose wafer transfer handling apparatus having an articulated arm assembly which extends and retracts in a "froglike" motion to transfer an object such as a wafer between a plurality of locations. Two articulated arms are operatively coupled such that when one arm is driven by a motor the articulated arms extend and retract in a "froglike" or "frogkick" type of motion. A platform is coupled to the arms and has the object to be transferred disposed thereon.

However, the articulated arm assembly of such transfer apparatus can support only a single platform, which limits through-put. Accordingly, there exists a need for a simple and reliable transfer device that will not damage the objects being transferred, and that is capable of increasing throughput with respect to the prior art devices.

SUMMARY OF THE INVENTION

The present invention provides a simple and reliable device for transferring objects, such as silicon wafers, camera lenses, crystal oscillators, or the like, between a plurality of locations disposed in various axial and radial planes. This apparatus includes a support, two sets of forearms articulated to a pair of upper (or driven) arms, a platform or end effector or other suitable holder coupled to each set of forearms, and a motor to drive one of the upper arms. The pair of upper arms and the two pairs of forearms are operatively coupled such that when one upper arm is driven by the motor the forearms extend and retract in a "froglike" or "frogkick" type of motion. When the extended end effector is empty and the retracted end effector is full, retraction of the empty end effector can be accomplished at high accelerations and speeds without imparting high acceleration and speed to the occupied end effector, which might otherwise cause the substrate to move relative to the end effector. This reduces the time interval from delivery of the first substrate to delivery of the second substrate.

The articulated arm assembly is preferably coupled to a base via a rotation motor such that the entire articulated arm assembly may be rotated in a radial plane. Like the single-platform apparatus of the prior art, such rotation is done when the end effectors are not in an extended position. However, unlike the situation in the prior art, in the apparatus of the present invention complete retraction of one end effector necessarily involves complete extension of the other end effector, and consequently in the the present invention rotation of the support occurs when both end effectors are in an intermediate "park" position. The provision of this "park" position is an important feature of the present invention.

The articulated arm assembly is also, in one embodiment, preferably coupled to the base via a plurality of flexures or levers that are responsive to a force such that the platform assembly may be displaced in an axial direction. In another embodiment, the arm assembly is mounted, by means other than flexures, for axial movement through a much larger range than that attainable with flexures. The assembly is adaptable for use in a variety of environments, including operation in a vacuum chamber or other controlled environment. The assembly may be mounted for movement inside a vacuum chamber with a vacuum seal between the assembly and its support.

BRIEF DESCRIPTION OF THE DRAWINGS

FIG. 1A is a plan view of an articulated arm assembly in accordance with the present invention in a left-extended position;

FIG. 1B is a plan view of an articulated arm assembly in accordance with the present invention in a park position;

FIG. 1C is a plan view of an articulated arm assembly in accordance with the present invention in a right-extended position;

FIG. 5 shows schematically a processing sequence using an articulated arm assembly in accordance with the present invention;

FIG. 6 shows schematically a processing sequence using prior art apparatus;

DETAILED DESCRIPTION OF THE INVENTION

Figure 2:
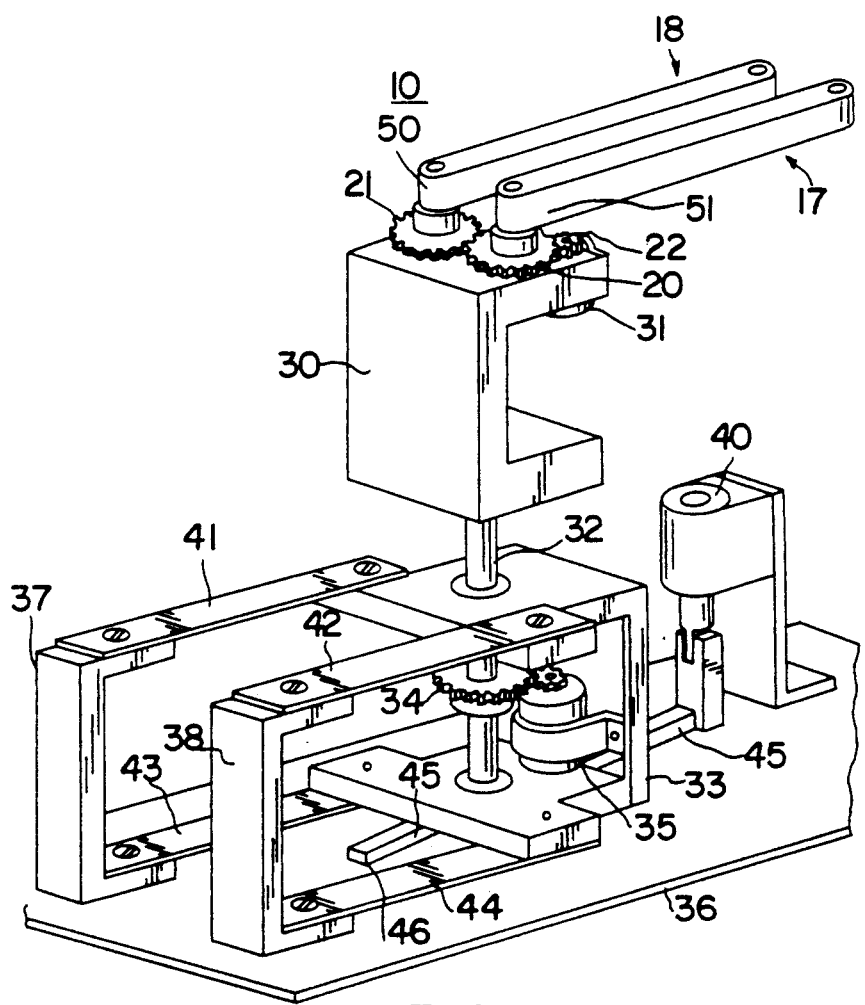
FIG. 2 is an isometric view of prior art apparatus which may be used in an embodiment of the present invention.

The apparatus of the invention comprehends a first shoulder pivot 50, a second shoulder pivot 51, a center line equidistant from said first and second shoulder pivots, a first upper arm 18 rotatably mounted on said first shoulder pivot 50 and having first elbow joint means comprising at least one first elbow pivot spaced from said first shoulder pivot by an upper-arm length, a second upper arm 17 rotatably mounted on said second shoulder pivot 51 and having second elbow joint means comprising at least one second elbow pivot spaced from said second shoulder pivot by said upper-arm length, a first primary forearm 12 rotatably mounted on a first elbow pivot and having a first primary wrist pivot spaced from said first elbow pivot by a primary forearm length, a second primary forearm 13 rotatably mounted on a second elbow pivot and having a second primary wrist pivot spaced from said second elbow pivot by said primary forearm length, a primary holding means 25 mounted on said primary wrist pivot, a primary coupling between said primary wrist pivots adapted to prevent rotation of said primary holding means and confine movement thereof to translation along said center line, the magnitude of the sum of said primary forearm length and the separation of either of said primary wrist pivots from said center line being greater than the magnitude of the maximum separation of either of said elbow joints from said center line, a first secondary forearm 14 rotatably mounted on a first elbow pivot and having a first secondary wrist pivot spaced from said first elbow pivot by a secondary forearm length, a second secondary forearm 15 rotatably mounted on a second elbow pivot and having a second secondary wrist pivot spaced from said second elbow pivot by said secondary forearm length, a secondary holding means 25' mounted on said secondary wrist pivots, a secondary coupling between said secondary wrist pivots adapted to prevent rotation of said secondary holding means and confine movement thereof to translation along said center line, the magnitude of the sum of said secondary forearm length and the separation of either of said secondary wrist pivots from said center line being greater than the magnitude of the maximum separation of either of said elbow joints from said center line, and means capable of driving said first upper arm for rotation through an angle in the range of from greater than 120° up to and including 180° to move said primary holding means between a primary extended position and a primary retracted position while simultaneously moving said secondary holding means between a secondary retracted position and a secondary extended position.

The holding means is for semiconductor wafers or the like. It moves along the center line. The velocity of the holding means is a function of the component, parallel to the center line, of the velocity of the elbow pivots. Thus, constant angular velocity of the upper arms would maximize the velocity of the support when the upper arms are extensions of one another.

If the magnitude of the forearm length plus the separation of either wrist pivot from the center line is designated "A" and the magnitude of the upper arm length plus the separation of either shoulder pivot from the center line is designated "B", then the following is true. If A is less than B, the system will jam before the upper arms can be extensions of one another. If A=B and the shoulder pivot separation is equal to the wrist pivot separation, then the forearms are capable of superimposed movement. If A=B and the wrist separation exceeds the shoulder separation, then the wrist pivots can "overshoot" the shoulder pivots. If A=B (or if A is greater than B) and the wrist separation is less than the shoulder separation, then the wrist pivots never overlap the shoulder pivots.

The apparatus on one side of the center line is the mirror image of that on the other side of the center line.

If, as is usually the case, the difference between the forearm length and the upper arm length is quite small, then the holding means moves nearly twice the arm length as it travels between the fully extended position and the park position, while it only travels a little more than the aforementioned difference as it travels between the park position and the fully retracted position.

The ability of the apparatus of the invention to enable a single drive mechanism to impart different velocities along a common center line to two end effectors results from the following properties of the drive structure. If the essence of the drive structure is simplified, each end effector is driven by a drive structure which comprehends a slight deviation from a rhombus in which one apex is selected as a pivot about which the sides adjacent to the apex may rotate. Considering now the rhombus itself, as the sides adjacent to the apex are rotated, the angle at the apex approaches 180°, the area of the rhombus vanishes, and one pair of adjacent sides is superimposed over the other pair of adjacent sides. Further rotation can be done in one of two ways; it can either be done in such a way as to open up the rhombus, or it can be done in such a way as to keep the rhombus closed and to keep the pairs of sides superimposed over one another. The former causes the apex opposite to the pivot-apex to move away from the pivot-apex at high velocity. The latter imparts no translational velocity to either of these apices.

The structure of the apparatus of the invention makes use of the aforementioned property by causing the two drive structures to operate in different ways: one drive structure is operated so as to open up the rhombus, imparting high velocity to its end effector, while the other drive structure is operated so as to keep its rhombus closed, imparting negligible velocity to its end effector.

The structure of the apparatus of the invention includes a drive mechanism having a pair of drive arms coupled at one end for counter-rotation so that the free ends move in mirror-image (about said center line) semi-circular arcs as the coupled ends rotate. Two separated pairs of forearms are each connected between said free ends, and each pair supports a holding means (such as an end effector) at the inter-forearm connection. The link structure formed by the two pairs of forearms is usually not a rhombus, but it is rhomboidal. Moreover, each pair of forearms forms a rhomboidal drive structure with the drive arms. When the drive arms move from one extreme (in which the drive arms are substantially mutually adjacent and one holding means is extended out from the coupled ends of the drive arms) to the "park" position (in which the drive arms are mutual rectilinear extensions of each other), the extended holding means moves rapidly towards its park position, the area bounded by the rhomboidal link structure expands from a narrow strip along the center line to a square and then contracts to a narrow strip perpendicular to the center line. The area bounded by the rhomboidal structure formed by the drive arms and the forearms under the retracting holding means changes shape substantially similarly to the change in shape of the link structure. Meanwhile, the area bounded by the drive arms and the forearms under the non-retracting holding means remains negligible, and the non-retracting holding means undergoes negligible motion.

When the drive arms continue past the "park" position toward the opposite extreme (in which the drive arms are substantially mutually adjacent and the other holding means is extended out from the coupled ends of the drive arms), the previously extended holding means undergoes negligible motion, and the area bounded by the rhomboidal link structure expands from a narrow strip perpendicular to the center line to a square and then contracts to a narrow strip along the center line. The rhomboidal area bounded by the structure formed by the drive arms and the forearms under the now extending holding means changes shape substantially similarly to the change in shape of the link structure. Meanwhile, the area bounded by the drive arms and the forearms under the retracting holding means remains negligible.

A feature of the invention is thus to transfer the aforementioned properties of the rhombus to structures which are merely rhomboidal in such a manner as to enable a single drive mechanism to impart differing velocities to two end effectors driven thereby.

All of this means that in accordance with the invention it is possible safely to accelerate and decelerate the retracting arm very quickly without imparting a similarly high acceleration and deceleration to the second end effector. This becomes a throughput benefit when the extended end effector is empty after placing a wafer while the retracted end effector is still occupied. Since the wafer is, in many applications, held to the end effector only by surface friction, rapid accelerations or decelerations of the occupied end effector can cause the wafer to shift on the end effector, which is undesirable.

Turning now to FIGS. 1A, 1B and 1C, there is shown an articulated arm assembly 10 in accordance with the present invention. The articulated arm assembly 10 includes a first pair of forearms 12 and 13 and a second pair of forearms 14 and 15. Each forearm is articulated to an upper arm (shown under forearms 12, 13) by any suitable means, such as a pinned connection 16. The forearms are driven by upper arms 17, 18 (best seen in FIG. 1B).

FIGS. 1A, 1B and 1C illustrate the three basic positions of the articulated arm assembly 10. FIG. 1A shows the assembly 10 in a substantially fully left-extended position relative to base 19. FIG. 1B shows assembly 10 in a park or "home" position relative to base 19, and FIG. 1C shows assembly 10 in a substantially fully right-extended position relative to base 19.

Figure 2A:
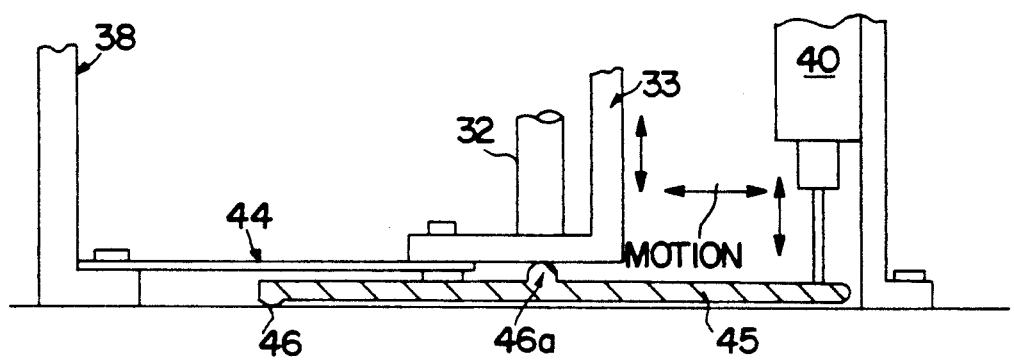
FIG. 2A is a side view of the apparatus shown in FIG. 2.
Figure 2B:
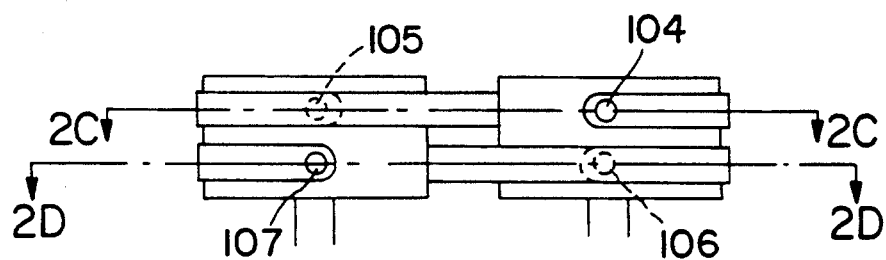
FIG. 2B is a side view of a band and drum assembly.
Figure 2C:
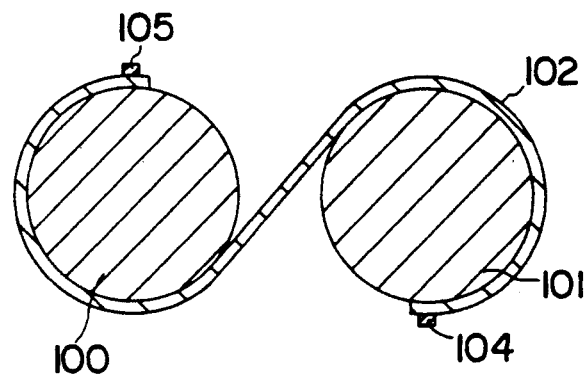
FIG. 2C is a cross section along the line 2C—2C in FIG. 2B.
Figure 2D:
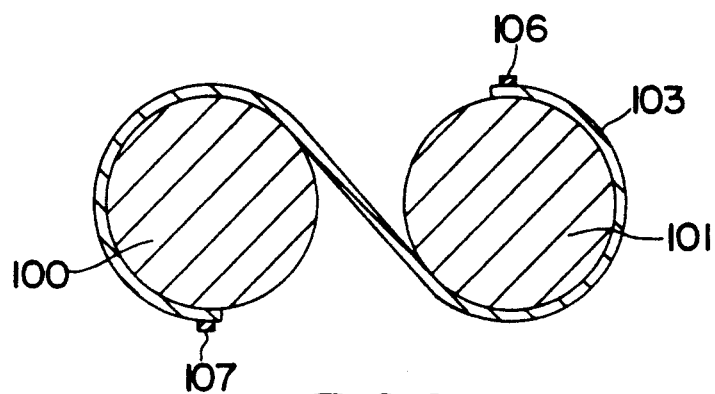
FIG. 2D is a cross section along the line 2D—2D in FIG. 2B.

As shown in FIG. 2, upper arms 17, 18 include generally circular gears 20, 21, respectively. The gears 20, 21 may be integrally formed as part of the upper arms 17, 18 or they may be individually formed and affixed to the upper arms by any suitable fastening method. The gear 20 is operatively coupled to a drive pinion 22. The gear 20 is driven by the drive pinion 22 and in turn gear 20 drives gear 21. The drive gears 20 and 21 and the pinion 22 may be replaced by any suitable drive mechanism such as frictional surfaces or band and drum assemblies. A suitable band and drum assembly is shown in FIGS. 2B, 2C and 2D. Referring thereto, drum 100 is coupled to drum 101 by two bands 102 and 103. Band 102 is affixed to drum 101 by a screw 104 (or rivet or other means of attachment such as welding). Band 102 is affixed to drum 100 by a screw 105. Band 103 is affixed to drum 100 by a screw 107. The bands 102, 103 are under tension and may be made of metal. Each band approximates an "S" shape and this shape is reversed as between bands. Thus, as band 100 rotates clockwise, screw 105 pulls band 102, which pulls screw 104 and causes drum 101 to rotate counter-clockwise. As band 100 rotates counter-clockwise, screw 107 pulls band 103, which pulls screw 106 and causes drum 101 to rotate clockwise. Accordingly, rotation of either drum 100 or drum 101 will cause the other drum to rotate in the opposite sense.

Figure 4:
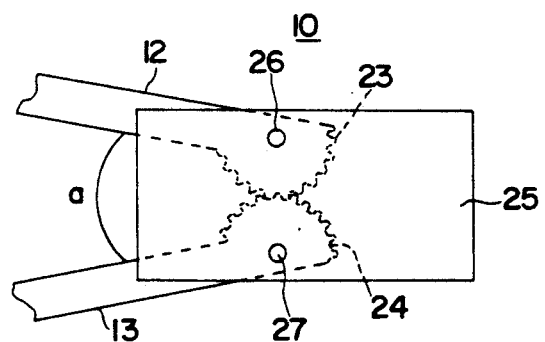
FIG. 4 is a plan view of a portion of the articulated arm assembly of FIG. 3.

As best seen in FIG. 4, the wrist joints of the forearms 12 and 13 include semicircular anti-rotation gears 23, 24. A platform or end effector 25 or other suitable holder for carrying the object is coupled to the anti-rotation gears 23, 24 by bearings 26, 27. The anti-rotation gears 23, 24 may be replaced by any suitable means to prevent the rotation of the ends of upper arms 12 and 13 such as frictional surfaces or drum and band assemblies. Similarly, forearms 14 and 15 include anti-rotation gears or the like and a platform coupled thereto.

It can be appreciated that as the drive pinion 22 rotates in a clockwise direction, gear 20 and drive arm 17 rotate in a counterclockwise direction, and gear 21 and drive segment 18 rotate in a clockwise direction.

Consequently, the forearms 14, 15 retract in a "frog-like" motion and displace the platform 25' toward the drive gears 20, 21. The anti-rotation gears 23', 24' prevent slewing of the platform 25', thereby providing a straight line motion of the object being transported.

As the platform 25' is retracting towards the drive gears 20, 21, forearms 12, 13 are in motion such that angle "a" between upper arms 12 and 13 (FIG. 4) is increasing. However, platform 25, which is positioned substantially over drive gears 20, 21 in the fully left-extended position, accelerates very slowly from zero velocity until (subject to control by the motion-control profile) it approaches a maximum velocity as it approaches the park position shown in FIG. 1B. Thereafter platform 25' continues toward a position substantially over drive gears 20, 21 and forearms 12, 13 continue to extend.

For various reasons the forearms 12, 13, 14 and 15 (i.e. the pivot-to-pivot distance plus the separation of the wrist pivot from the center line) must be longer than the upper arms 17 and 18 (i.e. the pivot-to-pivot distance plus the separation of the shoulder pivot from the center line). Preferably the forearms are only slightly longer (e.g., about 0.25 inches) than the upper arms, in order to achieve smooth motion. The particular length of the forearms depends upon the size of the objects being transferred. The larger the object, the longer the arms have to be.

Referring now to FIG. 2, an exploded isometric view of a prior art apparatus capable of use with the invention is provided. The articulated arm assembly 10 is shown as being disposed on a C-shaped support 30 via shoulder joints 50, 51. An electric motor 31 is mounted on the support 30 and coupled to the drive pinion 22. The drive pinion engages gear 20 which drives gear 21 causing the articulated arm assembly 10 to extend and retract as described above. The support 30 is coupled to a shaft 32 which is journalled in a second C-shaped support 33. The shaft 32 includes a rotation gear 34 which is coupled to an electric motor 35 which rotates the entire articulated arm assembly 10. In accordance with the invention, when the arms are in the park position, platforms 25 and 25' are almost centered above the shaft 32, minimizing any centrifugal forces on the substrate(s) being transported.

The support 33 is coupled to a base 36 via C-shaped supports 37, 38 and flexures 41–44. A lift mechanism 40 such as a solenoid is disposed on the base 36 and is coupled to a lever 45. The lever 45 is disposed beneath the shaft 32. One end of the lever 45 serves as a first fulcrum 46 disposed on the base 36, and a second fulcrum (see FIG. 2A) is disposed at the bottom of shaft 32. When the mechanism 40 is activated, the shaft 32 is displaced upwards in an axial direction, thereby causing the flexures 41–44 to deflect. It can be appreciated that as the shaft 32 is displaced axially the entire articulated arm assembly 10 is also axially displaced.

In accordance with the invention one or more amoung the motor 31, the motor 35 and the lift mechanism 40, are controlled by electronic logic circuits (not shown in FIG. 2) to provide precise control of the articulated arm assembly 10.

Figure 3:
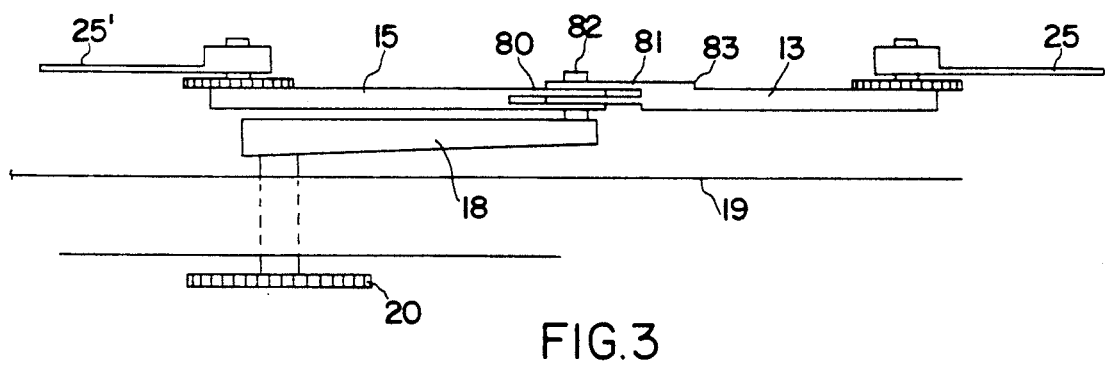
FIG. 3 is a side view of an articulated arm assembly in accordance with the present invention.

Forearms 12, 13, 14 and 15 may be coupled to upper arms 17, 18 by any suitable means, provided that the joint does not deleteriously affect motion described above. FIG. 3 depicts a single shaft elbow joint embodiment wherein each opposite forearm is coupled to the same shaft. Forearm 15 is shown having at its coupled end a C-shaped portion 80 having holes through which elbow shaft 82 passes. Similarly, forearm 13 is shown having at its coupled end a C-shaped portion 81 having holes through which elbow shaft 82 passes. Elbow shaft 82 is affixed to upper arm 18 forming an elbow joint therewith. Forearm 13 has a step configuration at 83 so that platform 25 is in the same horizontal plane as platform 25'.

FIGS. 5 and 6 illustrate by example a comparison between the operation of the apparatus of the present invention and that of a prior art device having only one pair of forearms. In both FIGS. 5 and 6, Module 1 is a process module and Modules 2 and 3 are hold areas for processed and unprocessed wafers, respectively. The following Tables 1 and 2 show the position of the articulated arm assembly and the status of the process module for FIGS. 5 and 6, respectively:

TABLE 1

| Fig. 5 | Position of Articulated Arm Assembly | Status of Module 1 |
|---|---|---|
| a | Picking up wafer A from Mod. 3 | Working (processing wafer B) |
| b | Park | Idle (processing of wafer B completed) |
| c | Picking up wafer B from | Idle |

TABLE 1-continued

| Fig. 5 | Position of Articulated Arm Assembly | Status of Module 1 |
|---|---|---|
|   | Mod. 1 |   |
| d | Park | Idle |
| e | Rotating 180° | Idle |
| f | Placing wafer A into Mod. 1 | Idle |
| g | Park | Working (processing wafer A) |
| h | Rotate 90° | Working |
| i | Placing wafer B in Mod. 2 | Working |
| j | Park | Working |

TABLE 2

| Fig. 6 | Position of Articulated Arm Assembly | Status of Module 1 |
|---|---|---|
| a | Park | Idle (processing of wafer B completed) |
| b | Picking up wafer B from Mod. 1 | Idle |
| c | Park | Idle |
| d | Rotate 90° & Placing wafer B in Mod. 2 | Idle |
| e | Park | Idle |
| f | Rotate 90° & Retrieve wafer A | Idle |
| g | Park | Idle |
| h | Rotate 180° | Idle |
| i | Placing wafer A in Mod. 1 | Idle |
| j | Park | Working (processing wafer A) |

The foregoing demonstrates an important advantage of the compound arm of the present invention in minimizing the amount of time the process module is idle and increasing system throughput thereby.

Figure 7:
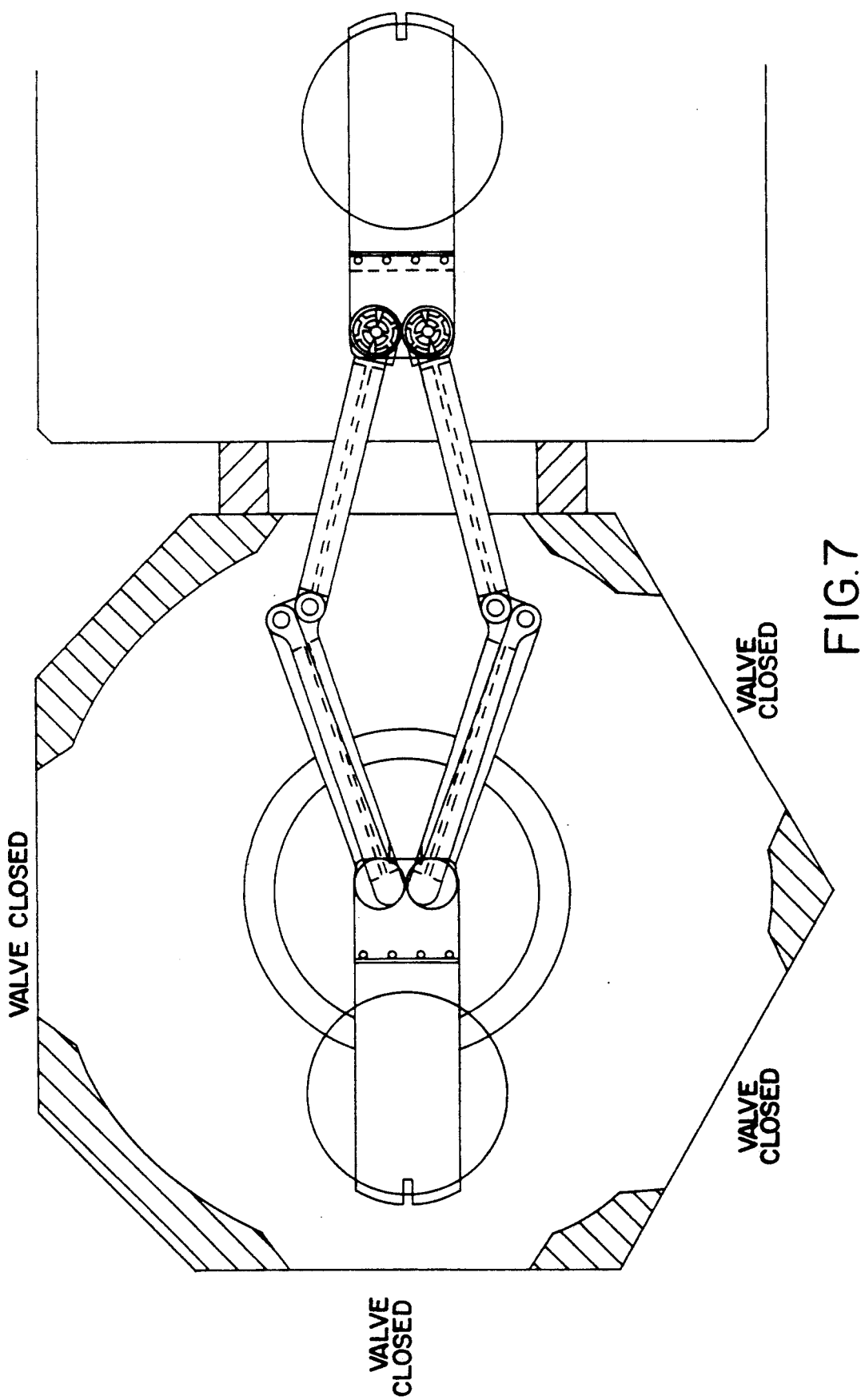
FIG. 7 shows one wafer in a process chamber while the other is at the retracted position.

The instant invention is also advantageous in that when the first end effector is extended to deliver the substrate into a process module, the center of a substrate on the second end effector never moves closer to the open process module than the location of the drive shafts. This reduces the possibility that the second substrate might be contaminated by gasses or particles or affected by heat or cold in the immediate vicinity of the open process module. This feature of the invention is best shown in FIG. 7.

Figure 8:
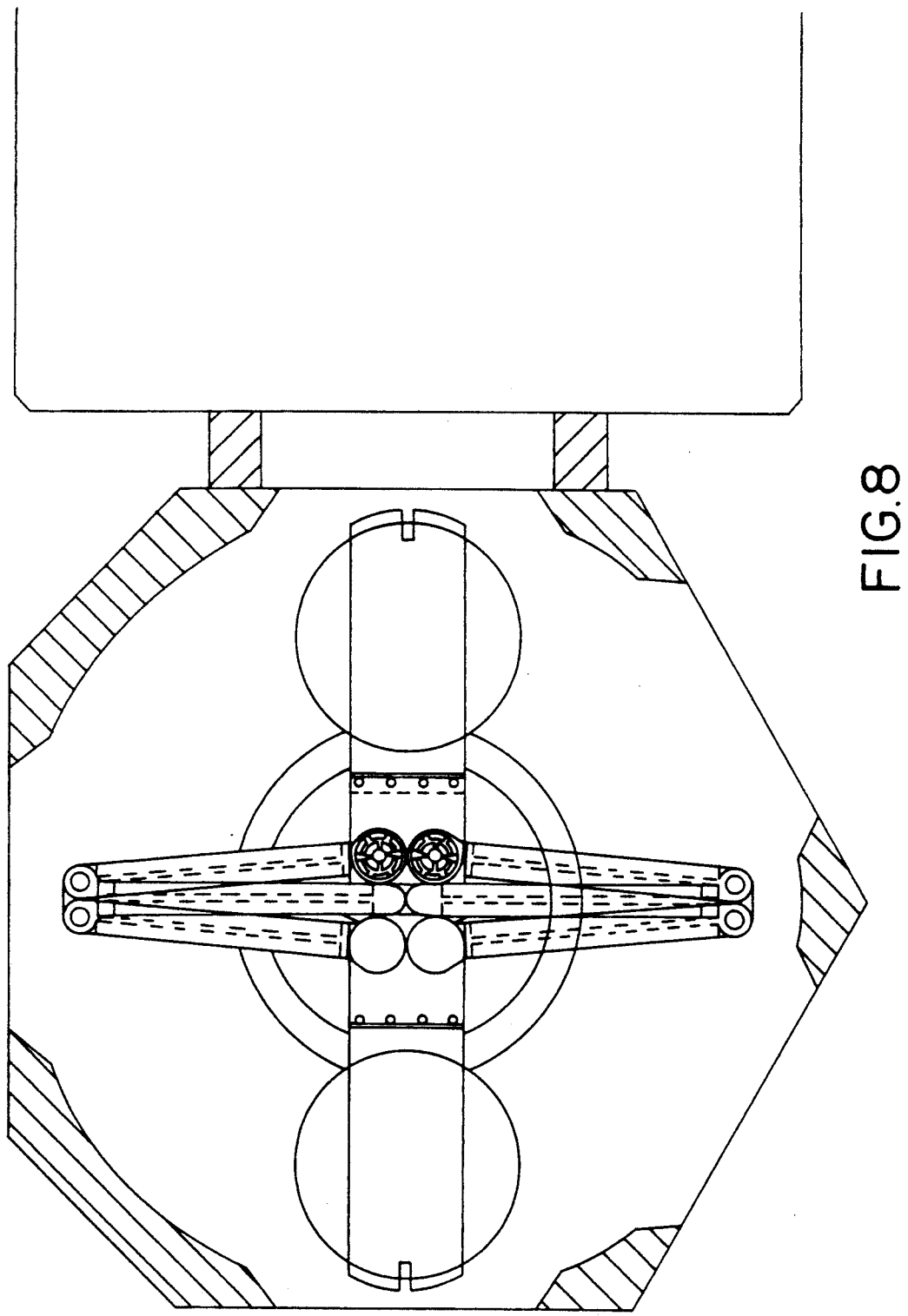
FIG. 8 shows the same arm as that of FIG. 7, but in the park position.
Figure 9:
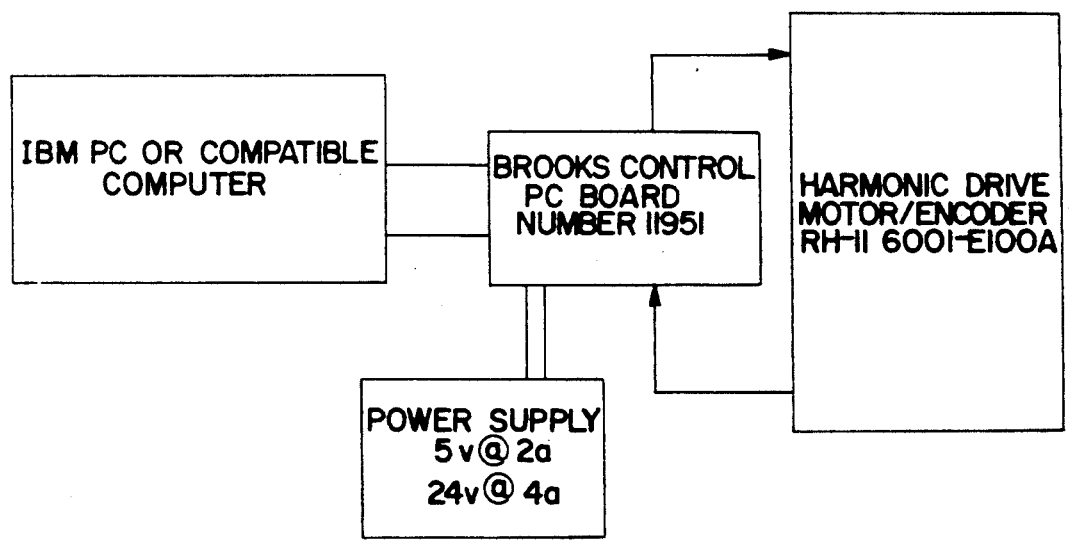
FIG. 9 is a block diagram of a typical motion control servo.

FIG. 8 shows the same arm in the park position, illustrating that, in this design, the end effectors are very close to the center of rotation when the arm is at park.

Electronic or mechanical means may be utilized for providing controlled velocity and/or acceleration profiles for the end effector motions. Referring now to FIG. 11, a typical system for providing profiled motion would consist of an IBM PC computer coupled via a serial communications line to Brooks Automation's control PC board #11951 that controls a gear motor/encoder package such as Harmonic Drive RH-11 6001-E100A.

Having thus described the principles of the invention, together with illustrative embodiments thereof, it is to be understood that although specific terms are employed, they are used in a generic and descriptive sense and not for purposes of limitation, the scope of the invention being set forth in the following claims.

I claim:

1. An apparatus for transferring objects, comprising: a support;
a first upper arm supported on said support so as to be rotatable about a first axis;
a second upper arm supported on said support so as to be rotatable about a second axis; means connected between said first and second arms for causing said second upper arm to be driven by rotation of said first upper arm;

a first pair of forearms articulated to said first and second upper arms;

a second pair of forearms articulated to said first and second upper arms;

each of said upper arms being of lesser length than each forearm;

first holding means pivotally coupled to said first pair of forearms and second holding means pivotally coupled to said second pair of forearms, an engagement means connected between said first pair of forearms and preventing rotation of said first holding means, and an engagement means connected between said second pair of forearms and preventing rotation of said second holding means; and means capable of driving said first upper arm for rotation through an angle in the range of from greater than 120° up to and including 180° to move said first holding means between a first extended position and a first retracted position while simultaneously moving siad second holding means between a second retracted position and a second extended position.

2. An apparatus according to claim 1, further comprising means connected to said support for moving said support in a direction substantially parallel to said first axis.

3. An apparatus according to claim 1, wherein each of the forearms is joined to one of said upper arms by a pinned connection.

4. Apparatus for transporting an article, comprising in combination:

a support;

a first shoulder pivot supported on said support and defining an axis of rotation, a second shoulder pivot substantially parallel to said first shoulder pivot and supported on said support and a center line equidistant from said first and second shoulder pivots extending across said support, a first upper arm rotatably mounted on said first shoulder pivot and having first elbow joint means comprising at least one first elbow pivot spaced from said first shoulder pivot by an upper-arm length, a second upper arm rotatably mounted on said second shoulder pivot and having second elbow joint means comprising at least one second elbow pivot spaced from said second shoulder pivot by said upper-arm length a first primary forearm rotatably mounted on said first elbow pivot and having a first primary wrist pivot spaced from said first elbow pivot by a primary forearm length a second primary forearm rotatably mounted on said second elbow pivot and having a second primary wrist pivot spaced from said second elbow pivot by said primary forearm length, a primary holding means mounted on said primary wrist pivots a primary coupling between said primary wrist pivots adapted to prevent rotation of said primary support and confine movement thereof to translation along said center line the magnitude of the sum of said primary forearm length and the separation of either of said primary wrist pivots from said center line being greater than the magnitude of the maximum separation of either of said elbow joints from said center line, a first secondary forearm rotatably mounted on said first elbow pivot and having a first secondary wrist pivot spaced from said first elbow pivot by a secondary forearm length, a second secondary forearm rotatably mounted on said second elbow pivot and having a second secondary wrist pivot spaced from said second elbow pivot by said secondary forearm length, a secondary holding means mounted on said secondary wrist pivots, a secondary coupling between said secondary wrist pivots adapted to prevent rotation of said secondary holding means and confine movement thereof to translation along said center line, the magnitude of the sum of said secondary forearm length and the separation of either of said secondary wrist pivots from said center line being greater than the magnitude of the maximum separation of either of said elbow joints from said center line, and means capable of driving said first upper arm for rotation through an angle in the range of from greater than 120° up to and including 180° to move said primary holding means between a primary extended position and a primary retracted position while simultaneously moving said secondary holding means between a secondary retracted position and a secondary extended position.

5. An apparatus according to claim 4, further comprising means for moving said support in a direction substantially parallel to said axis of rotation.

6. An apparatus according to claim 4, further comprising a coupling mechanism coupled between said first and second upper arms.

7. Apparatus for imparting different translational movement along a center line to each of a pair of separated holding means, said apparatus comprising a drive mechanism including a pair of drive arms coupled at one end for counter-rotation so that the free ends move in mirrorimage (toward and away from said center line) semicircular arcs as the coupled ends rotate, and a rhomboidal link structure comprising two separated pairs of forearms, each pair having an inter-forearm connection which is adapted to move along said center line, each pair of forearms being connected between said free ends so that said movement of said free ends drives said inter-forearm connections so that they move along said center line, and a holding means supported at each inter-forearm connection.

8. An apparatus according to claim 7, further comprising means for moving the entire assembly of arms in a direction substantially parallel to the axes of rotation thereof.

9. An apparatus according to claim 7, wherein each free end of each said pair is connected to its respective holding means by a pivot which is spaced from but adjacent to the corresponding pivot of the free end of the other forearm of its pair, and wherein said each pair of forearms is engaged with means for preventing rotation of said holding means.

* * * * *